United States Patent
Zhang et al.

(10) Patent No.: US 8,531,899 B2
(45) Date of Patent: *Sep. 10, 2013

(54) METHODS FOR TESTING A MEMORY EMBEDDED IN AN INTEGRATED CIRCUIT

(75) Inventors: Shayan Zhang, Austin, TX (US); James D. Burnett, Austin, TX (US); Kent P. Fancher, Austin, TX (US); Andrew C. Russell, Austin, TX (US); Michael D. Snyder, Cedar Park, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/613,630

(22) Filed: Sep. 13, 2012

(65) Prior Publication Data

US 2013/0019133 A1   Jan. 17, 2013

Related U.S. Application Data

(62) Division of application No. 12/414,758, filed on Mar. 31, 2009, now Pat. No. 8,379,466.

(51) Int. Cl.
*G11C 7/00* (2006.01)

(52) U.S. Cl.
USPC ........... 365/200; 365/201; 365/226; 365/154; 365/189.02; 365/205; 365/207; 365/230.03; 365/230.06

(58) Field of Classification Search
USPC .................... 365/200, 201, 226, 154, 189.02, 365/205, 207, 230.03, 230.06
See application file for complete search history.

(56) References Cited

U.S. PATENT DOCUMENTS

| | | | |
|---|---|---|---|
| 4,085,175 | A | 4/1978 | Keuchel |
| 5,159,571 | A | 10/1992 | Ito et al. |
| 5,298,816 | A | 3/1994 | Kaplinsky |
| 5,428,574 | A | 6/1995 | Kuo et al. |
| 5,430,679 | A | 7/1995 | Hiltebeitel et al. |
| 6,067,597 | A | 5/2000 | Kozaru |
| 6,272,670 | B1 | 8/2001 | Van Myers et al. |
| 6,335,900 | B1 | 1/2002 | Kwon et al. |
| 6,342,807 | B1 | 1/2002 | Nolan et al. |
| 6,373,758 | B1 | 4/2002 | Hughes et al. |
| 6,457,093 | B2 | 9/2002 | Roohparvar |
| 6,757,204 | B2 | 6/2004 | Di Ronza et al. |

(Continued)

OTHER PUBLICATIONS

Wang, et al., "Canary Replica Feedback for Near-DRV Standby Vdd Scaling in a 90 nm SRAM", IEEE 2007 Custom Integrated Circuits Conference, Sep. 2007, pp. 29-32.

(Continued)

*Primary Examiner* — Fernando Hidalgo
(74) *Attorney, Agent, or Firm* — Sherry W. Schumm; James L. Clingan, Jr.

(57) ABSTRACT

A memory system has a first memory having an array of memory cells that includes a redundant column. The redundant column substitutes for a first column in the array. The first column includes a test memory cell. The array receives a power supply voltage. The test memory cell becomes nonfunctional at a higher power supply voltage than the memory cells of the array. A memory controller is coupled to the first memory and is for determining if the test memory cell is functional at a first value for the power supply voltage. This is useful in making decisions concerning the value of the power supply voltage applied to the array.

11 Claims, 8 Drawing Sheets

(56) References Cited

U.S. PATENT DOCUMENTS

| | | | |
|---|---|---|---|
| 6,765,428 B2 | 7/2004 | Kim et al. | |
| 6,788,566 B1 | 9/2004 | Bhavnagarwala et al. | |
| 6,791,864 B2 | 9/2004 | Houston | |
| 6,912,155 B2 | 6/2005 | Sakurai et al. | |
| 7,042,776 B2 | 5/2006 | Canada et al. | |
| 7,079,426 B2 | 7/2006 | Zhang et al. | |
| 7,085,175 B2 | 8/2006 | Remington et al. | |
| 7,181,564 B2 | 2/2007 | Ajiro | |
| 7,193,901 B2 | 3/2007 | Ruby et al. | |
| 7,215,176 B2 | 5/2007 | Abe | |
| 7,263,027 B2 | 8/2007 | Kim et al. | |
| 7,292,495 B1 | 11/2007 | Kenkare et al. | |
| 7,333,357 B2 | 2/2008 | Houston | |
| 7,333,385 B2 | 2/2008 | Yamaoka et al. | |
| 7,411,815 B2 | 8/2008 | Gogl | |
| 7,443,374 B2 | 10/2008 | Hudson | |
| 7,542,369 B2 | 6/2009 | Kenkare et al. | |
| 7,570,525 B2 | 8/2009 | Nil et al. | |
| 7,573,762 B2 | 8/2009 | Kenkare et al. | |
| 7,603,592 B2 * | 10/2009 | Sekiguchi et al. | 714/710 |
| 7,613,052 B2 | 11/2009 | Van Winkelhoff et al. | |
| 7,660,150 B2 | 2/2010 | Mikan, Jr. et al. | |
| 7,692,974 B2 | 4/2010 | Amirante et al. | |
| 7,733,686 B2 | 6/2010 | Clinton | |
| 7,793,172 B2 | 9/2010 | Bruce et al. | |
| 7,852,692 B2 | 12/2010 | Zhang et al. | |
| 7,864,617 B2 | 1/2011 | Kenkare | |
| 7,903,483 B2 | 3/2011 | Russell et al. | |
| 8,004,907 B2 | 8/2011 | Russell et al. | |
| 8,009,500 B2 | 8/2011 | Nil et al. | |
| 8,063,650 B2 | 11/2011 | Ong et al. | |
| 8,315,117 B2 | 11/2012 | Zhang et al. | |
| 8,379,466 B2 | 2/2013 | Zhang et al. | |
| 2004/0153732 A1 * | 8/2004 | Kamata | 714/6 |
| 2005/0036371 A1 | 2/2005 | Kushida | |
| 2005/0138537 A1 * | 6/2005 | Worley | 714/801 |
| 2006/0186935 A1 | 8/2006 | Hwang et al. | |
| 2006/0239068 A1 * | 10/2006 | Boemler | 365/185.01 |
| 2006/0262628 A1 | 11/2006 | Nil et al. | |
| 2007/0025167 A1 | 2/2007 | Ziegelmayer et al. | |
| 2007/0262890 A1 * | 11/2007 | Cornwell et al. | 341/51 |
| 2007/0285986 A1 | 12/2007 | Eguchi et al. | |
| 2008/0082873 A1 | 4/2008 | Russell et al. | |
| 2008/0091990 A1 | 4/2008 | Bruce et al. | |
| 2008/0158939 A1 | 7/2008 | Chen et al. | |
| 2008/0172523 A1 | 7/2008 | Tanaka et al. | |
| 2010/0208536 A1 * | 8/2010 | Deng et al. | 365/201 |
| 2010/0259285 A1 | 10/2010 | Koli et al. | |

OTHER PUBLICATIONS

U.S. Appl. No. 11/847,424, filed Aug. 30, 2007, Berens, M.S., et al., Flip-Flop Having Logic State Retention During a Power Down Mode and Method Therefore.

U.S. Appl. No. 12/275,622, Office Action—Rejection—dated Apr. 2, 2010.

U.S. Appl. No. 12/275,622, Office Action—Notice of Allowance—dated Sep. 17, 2010.

U.S. Appl. No. 12/275,622, Office Action—Notice of Allowance—dated Nov. 30, 2010.

U.S. Appl. No. 12/275,622, Office Action—Notice of Allowance—dated Jun. 2, 2011.

U.S. Appl. No. 12/388,911, Office Action—Notice of Allowance—dated Sep. 9, 2010.

U.S. Appl. No. 12/414,758; Office Action—Rejection—dated Feb. 3, 2011.

U.S. Appl. No. 12/414,758; Office Action—Notice of Allowance—dated Jun. 6, 2011.

U.S. Appl. No. 12/414,758; Office Action—Notice of Allowance—dated Jul. 26, 2011.

U.S. Appl. No. 12/414,758; Office Action—Notice of Allowance—dated Nov. 3, 2011.

U.S. Appl. No. 12/414,761; Office Action—Non-Final—dated Apr. 25, 2011.

U.S. Appl. No. 12/414,761; Office Action—Notice of Allowance—dated Sep. 27, 2011.

U.S. Appl. No. 12/414,761; Office Action—Notice of Allowance—dated Jan. 13, 2012.

U.S. Appl. No. 12/414,761; Office Action—Notice of Allowance—dated May 8, 2012.

U.S. Appl. No. 12/414,761; Office Action—Notice of Allowance—dated Aug. 31, 2012.

U.S. Appl. No. 12/433,330; Office Action—Rejection—dated May 26, 2011.

U.S. Appl. No. 12/433,330; Office Action—Notice of Allowance—dated Sep. 23, 2011.

U.S. Appl. No. 12/433,330; Office Action—Notice of Allowance—dated Feb. 6, 2012.

U.S. Appl. No. 12/433,330; Office Action—Non-Final—dated May 25, 2012.

U.S. Appl. No. 12/433,330; Office Action—Notice of Allowance—dated Sep. 7, 2012.

Office Action mailed May 28, 2013 in U.S. Appl. No. 12/433,330.

* cited by examiner

METHODS FOR TESTING A MEMORY EMBEDDED IN AN INTEGRATED CIRCUIT

CROSS-REFERENCE TO RELATED APPLICATION

This application is a divisional of co-pending, U.S. patent application Ser. No. 12/414,758, filed on Mar. 31, 2009.

In addition, this application is related to U.S. patent application Ser. No. 12/414,761, filed on Mar. 31, 2009, entitled "Integrated Circuit Having Assisted Access and Method Therefor", by Zhang et al., and assigned to the current assignee hereof.

BACKGROUND

1. Field

This disclosure relates generally to integrated circuits, and more specifically, to an integrated circuit having an embedded memory and method for testing the memory.

2. Related Art

One of the most common ways to reduce power consumption in integrated circuits is to lower the power supply voltage. However, lowering the power supply voltage can cause increased failures and unreliable operation in some circuits. For example, the lowest power supply voltage (VMIN) on which a SoC (system-on-a-chip) can operate is often limited by the memory arrays embedded on the SoC. The embedded memories typically require a large built-in speed/reliability guard band margin to cover device mismatches. Device mismatches may be caused by, for example, random dopant fluctuations, negative bias temperature instability, and hot carrier injection. The problem is made worse as transistor sizes are decreased.

Therefore, what is needed is an integrated circuit and method for solving the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
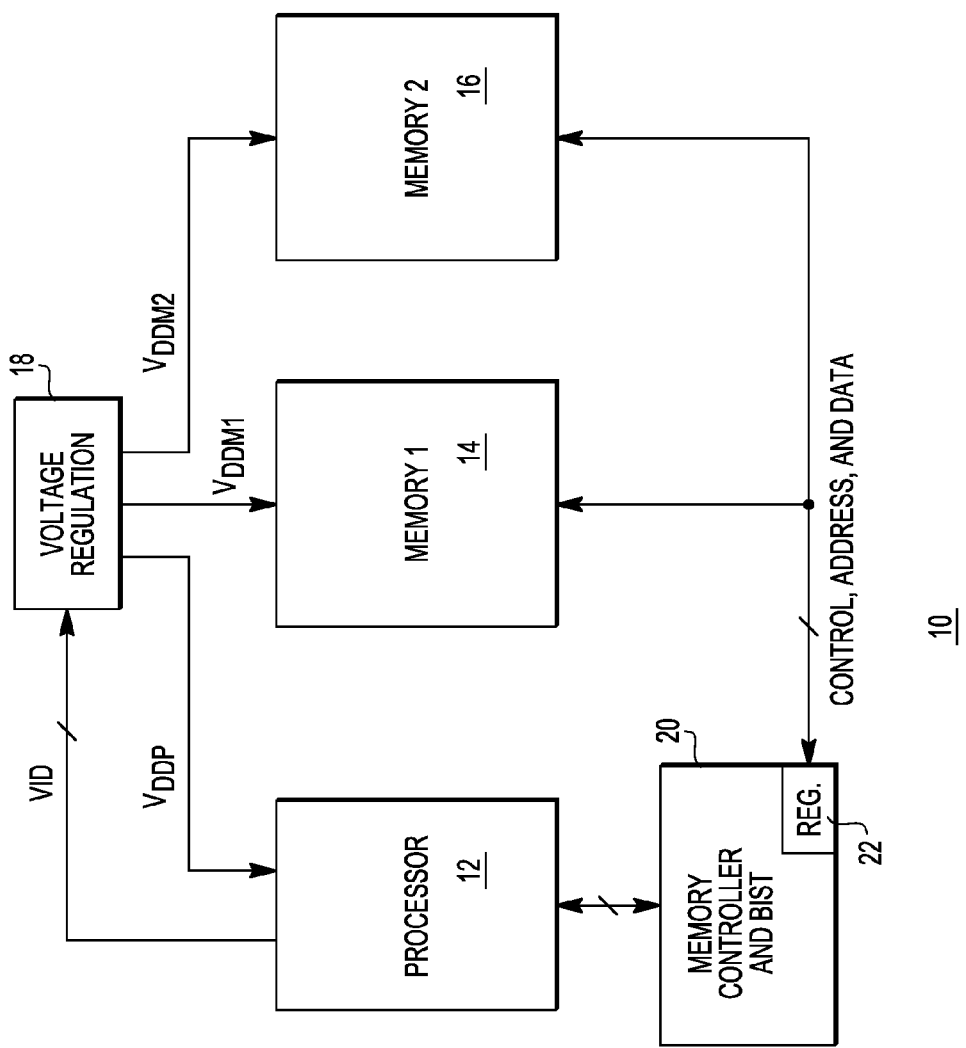
FIG. 1 illustrates, in block diagram form, a system in accordance with an embodiment.

Generally, there is provided, an embedded memory array and a method for testing the memory array. Test circuits are included on an integrated circuit SoC for determining the minimum supply voltage at which memory cells of the memory array will operate reliability. In one embodiment, a set of memory cells that fail at a predetermined VMIN voltage are identified. The set of memory cells may be among the weakest cells of the array and are assumed to fail first when the power supply voltage is lowered. The set of memory cells may be, for example, a row, a column, a portion of a row or column, or an individual cell. Redundant memory cells are used to substitute for the set of memory cells. The set of memory cells are then used as test cells to insure the memory operates reliably at lower power supply voltages. In one embodiment, the test cells are tested anytime the power supply voltage is lowered. The test cells may also be tested following a power on reset (POR) or power up. The test circuit includes a multiplexer and a comparator circuit. The multiplexer can be used to allow the logic state of the test cell to be compared with another memory cell during a read test or with an input data signal during a write test. The test circuit and test cell together provide a technique for determining a minimum operating voltage of the memory. Also, using one of the normal memory cells as the test cell provides more accurate local determination of the minimum power supply voltage than a memory that uses a special set of memory cells outside of the array. Control registers are provided in the memory controller to save the addresses of test cells.

In one aspect, there is provided, a memory system, comprising: a first memory having an array of memory cells includes a redundant column, wherein: the redundant column substitutes for a first column in the array, wherein the first column includes a test memory cell; the array receives a power supply voltage; and the test memory cell becomes non-functional at a higher power supply voltage than the memory cells of the array; and a memory controller, coupled to the first memory, for determining if the test memory cell is functional at a first value for the power supply voltage. The memory system may further comprise a voltage regulation circuit for supplying the power supply voltage. The memory system may further comprise a processor for selecting values of the power supply voltage for the voltage regulation circuit to provide to the array. The processor may select a second value, which is higher than the first value, of the power supply voltage for the voltage regulation circuit if the memory controller determines that the test memory cell is not functional with the power supply voltage at the first value. The processor may select a third value, which is less than the first value, of the power supply voltage for the voltage regulation circuit to supply to the array if the memory controller determines that the test memory cell is functional with the power supply voltage at the first value. If the processor selects the third value, the memory controller may determine if the test memory cell is functional at the third value for the power supply voltage. The processor may select a fourth value, which is less than the third value, of the power supply voltage for the voltage regulation circuit to supply to the array if the memory controller determines that the test memory cell is functional with the power supply voltage at the third value. The test memory cell may be more stable in a first logic state than a second logic state; and the memory controller may perform determining if the test memory cell is functional when the test memory cell is in the second logic state. The memory controller is further characterized as performing determining if the test memory cell is functional when the test memory cell is in the first logic state. The test memory cell may be coupled to a word line; a functional column may be adjacent to the first column; a functional memory cell in the functional column may be coupled to the word line; the memory controller may write data that is the same to the first column and the functional column; and the memory controller may determine if the test memory cell is functional by comparing a logic state of the functional memory cell to a logic state of the test memory cell. The first memory may comprise a plurality of sense amplifiers, wherein the first column may be coupled to first sense amplifier of the plurality of sense amplifiers; and each multiplexer of a plurality of multiplexers may be coupled to adjacent pairs of sense amplifiers of the plurality of sense amplifiers, wherein each sense amplifier may be coupled to two multiplexers of the plurality of multiplexers. The memory system may further comprise a second memory having a second array of memory cells that includes a second redundant column, wherein: the second redundant column substitutes for a second column in the second array, wherein the second column includes a second test memory cell; the second array receives a power supply voltage; and the second test memory cell becomes non-functional at a higher power supply voltage than the memory cells of the second array; and the memory controller, coupled to the second memory, is for determining if the second test memory cell is functional at second value for the power supply voltage.

In another aspect, there is provided, a method of operating a memory having an array, comprising: identifying a test memory cell in the array that is not functional at a power supply voltage of a specified value under specified conditions; defining a functional portion of the array that is functional at the power supply voltage of the specified value under the specified conditions; and determining if the test memory cell is functional at a first value for the power supply voltage. The step of identifying may be further characterized as determining that the test memory cell is functional at a power supply voltage greater than the specified value at the specified conditions. The method may further comprise applying a second value of the power supply voltage to the array if the test memory cell is not functional at the first value, wherein the second value is greater than the first value. The method may further comprise applying a third value of the power supply voltage to the array if the test memory cell is functional at the first value, wherein the third value is less than the first value. The method may further comprise determining if the test memory cell is functional at the third value for the power supply voltage. The method may further comprise returning the power supply voltage to the first value if test memory cell is not functional at the third value, wherein the first value is less than the specified value. The method may further comprise: providing a second memory having a second array; identifying a second test memory cell in the second array that is not functional at a power supply voltage of the specified value under the specified conditions; defining a functional portion of the second array that is functional at the power supply voltage of the specified value under the specified conditions; and determining if the test memory cell is functional at a second value for the power supply voltage.

In yet another aspect, there is provided, a method, comprising: providing a memory array having a plurality of memory cells having minimum operating voltages; identifying a test memory cell in the array whose minimum operating voltage, under specified conditions, is greater than a specified minimum operating voltage, wherein a difference between the minimum operating voltage of the test memory cell and the specified minimum operating voltage is within a predetermined range; applying a power supply voltage to the array at a first value less than the specified minimum operating range; and determining if the test memory cell is functional at the first value.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or a "B" following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

FIG. 1 illustrates, in block diagram form, a system 10 having an embedded memory in accordance with an embodiment. System 10 includes a processor 12, memories 14 and 16, voltage regulation circuits 18, memory controller and BIST (built-in self-test) 20, and registers 22. Processor 12 is bi-directionally coupled to memory controller and BIST 20. Memory controller and BIST 20 are bi-directionally coupled to memories 14 and 16 for transmitting and receiving signals labeled "CONTROL, ADDRESS, AND DATA". Processor 12 is coupled to voltage regulation circuit 18 for receiving a power supply voltage labeled "VDDP". Memories 14 and 16 are coupled to outputs of voltage regulation circuit 18 for receiving power supply voltages labeled "VDDM1" and "VDDM2", respectively. Processor 12 provides a digital voltage identifier labeled "VID" to an input of voltage regulation circuits 18 for selecting a magnitude of the power supply voltages provided to processor 12 and memories 14 and 16. In the illustrated embodiment, voltage regulation circuit 18 includes three voltage regulators and the VID includes a multi-bit bit field for each of the three voltage regulators. In response to the voltage identifier VID, voltage regulation circuit 18 provides one or more power supply voltages, each with a predetermined magnitude. Thus, processor 12 can change the power supply voltage to circuit blocks of system 10 depending on, for example, the operating mode of processor 12. For example, during a low power operating mode, processor 12 can assert an appropriate voltage identifier VID to lower one or more of the power supply voltages to reduce power consumption. In addition, during a self-test mode of memories 14 or 16, memory controller and BIST 20 can change the voltage identifier VID provided by processor 12 to provide the ability to test memories 14 and 16 at various power supply voltages. Registers 22 are illustrated as a portion of memory controller and BIST 20. However, in other embodiments, registers 22 may be located separately from memory controller and BIST 20. Registers 22 are used to store test information such as for example, VID, test cell addresses, and test patterns. Memory controller and BIST 20 as well as processor 12 use the stored information for testing and power supply control as described herein.

Figure 2:
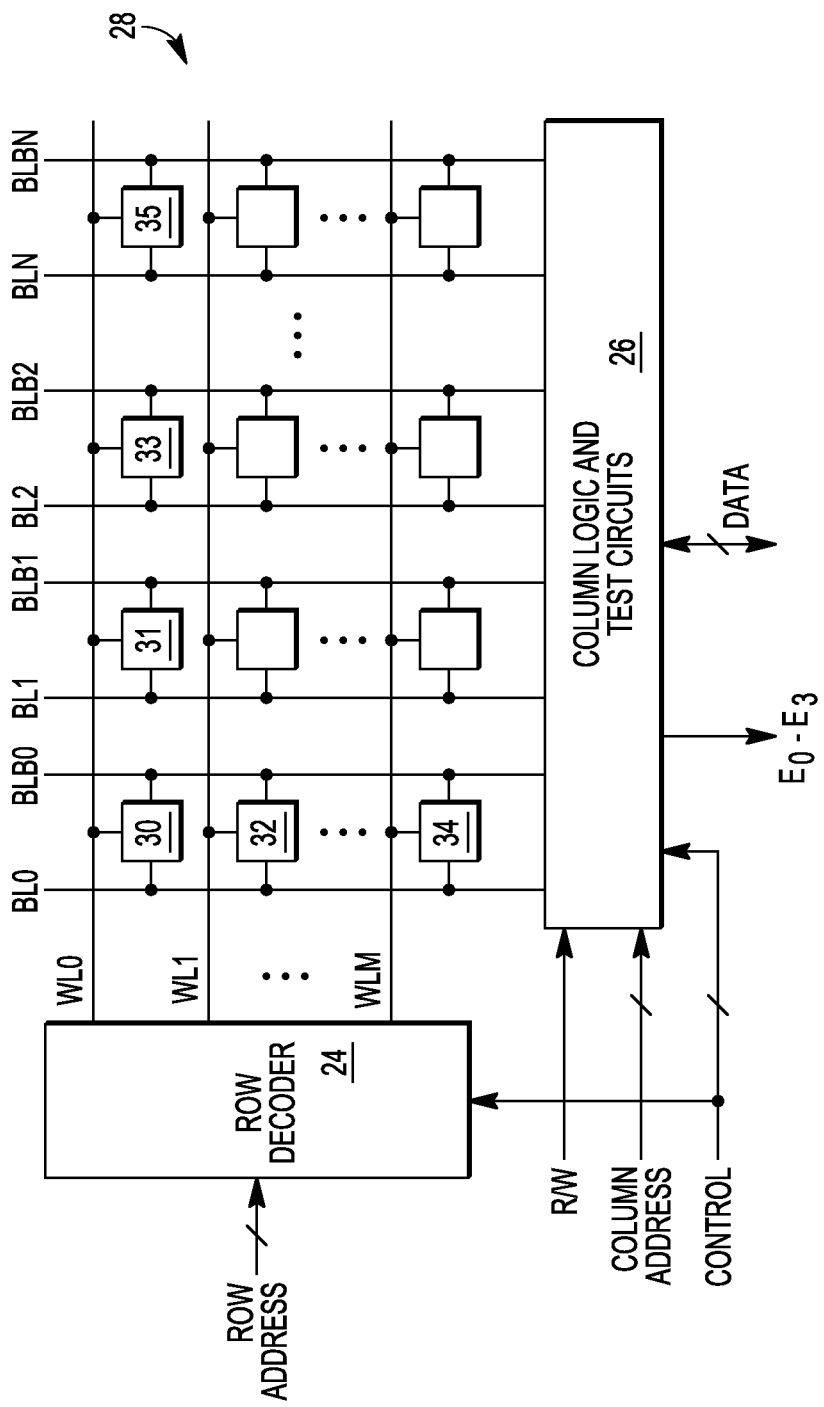
FIG. 2 illustrates, in block diagram form, one of the memories of FIG. 1 in more detail.

FIG. 2 illustrates, in block diagram form, memory 14 of FIG. 1 in more detail. Memory 14 includes row decoder 24, column logic and test circuits 26, and memory array 28. Memory array 28 includes a plurality of memory cells, such as for example, memory cells 30-35, organized in rows and columns. A row includes a word line and all of the memory cells coupled to the word line. For example, one row includes word line WL0 and memory cells 30, 31, 33, and 35. A column includes a bit line, or bit line pair, and all of the memory cells coupled to the bit line, or bit line pair. For example, one column includes bit line pair BL0/BLB0 and memory cells 30, 32, and 34. In one embodiment, the memory cells of array 28 may be static random access memory (SRAM) cells. In another embodiment, the memory cells may be another type of volatile or non-volatile memory. Column logic and test circuits 26 are coupled to each of the bit line pairs of memory array 28. Column logic and test circuits 26 also has an input for receiving address signals labeled "COLUMN ADDRESS", an input for receiving control signals labeled "CONTROL", an input for receiving a read/write control signal labeled "R/W", and a plurality of I/O (input/output) terminals for providing and receiving data signals labeled "DATA".

Row decoder 24 includes an input for receiving a multi-bit row address labeled "ROW ADDRESS", and an output coupled to each of the word lines. Row decoder 24 selects one of the word lines WL0-WLM in response to receiving a row address. Note that in the illustrated embodiment, a row stores multiple cache lines or portions of different cache lines for processor 12. In another embodiment, a row may store a single cache line or a portion of a single cache line in which case a column address and column multiplexers would not be used. Column logic 26 includes column multiplexers, sense amplifiers, bit line loads, write drivers, precharge and equalization circuits, and the like. Column logic 26 is coupled to each of the bit line pairs. During a read operation of memory array 28, the control signal R/W is asserted at a predetermined logic state, for example, a logic high, and a row address selects one of the word lines causing a stored logic state of each of the memory cells to be provided to a corresponding bit line pair in the form of a differential voltage. The column multiplexers of column logic 26 select one group of a plurality of column groups to couple to the sense amplifiers based on the column address. For example, in one embodiment, a 4-to-1 column multiplexer may be implemented where one in four columns is selected by the column multiplexers for coupling to the sense amplifiers or write drivers. The sense amplifiers of column logic 26 sense and amplify the differential voltages and corresponding signals are output from column logic 26 as data signals labeled "DATA". A write operation is essentially the opposite of a read operation. That is, control signal R/W is negated as, for example, a logic low, and data signals DATA are provided via write drivers to memory cells coupled to a word line selected by the row address.

One or more columns of memory array 28 are used as redundant columns to substitute for defective columns that are discovered during testing. The defective columns may be defective because of, for example, "hard" failures such as electrical opens or shorts. In accordance with one embodiment, the memory may be tested to determine a minimum voltage (VMIN) at which the memory array 28 can operate reliably. Memory cells that fail due to inadequate read or write margins before the desired minimum voltage is achieved may be "repaired" by substituting redundant memory cells for the failed memory cells. The failed memory cells are then used as control, or test, bits to insure reliable memory operation. Subsequent to lowering the power supply voltage to the array, the stored logic state of the test cell is compared to the logic state stored by one of the normal array cells. If a result of the comparison indicates that the test cell failed, then in one embodiment, the power supply voltage may be increased until the test cell does not fail. The test circuits of column logic and test circuits 26 will be described in more detail below.

Figure 3:
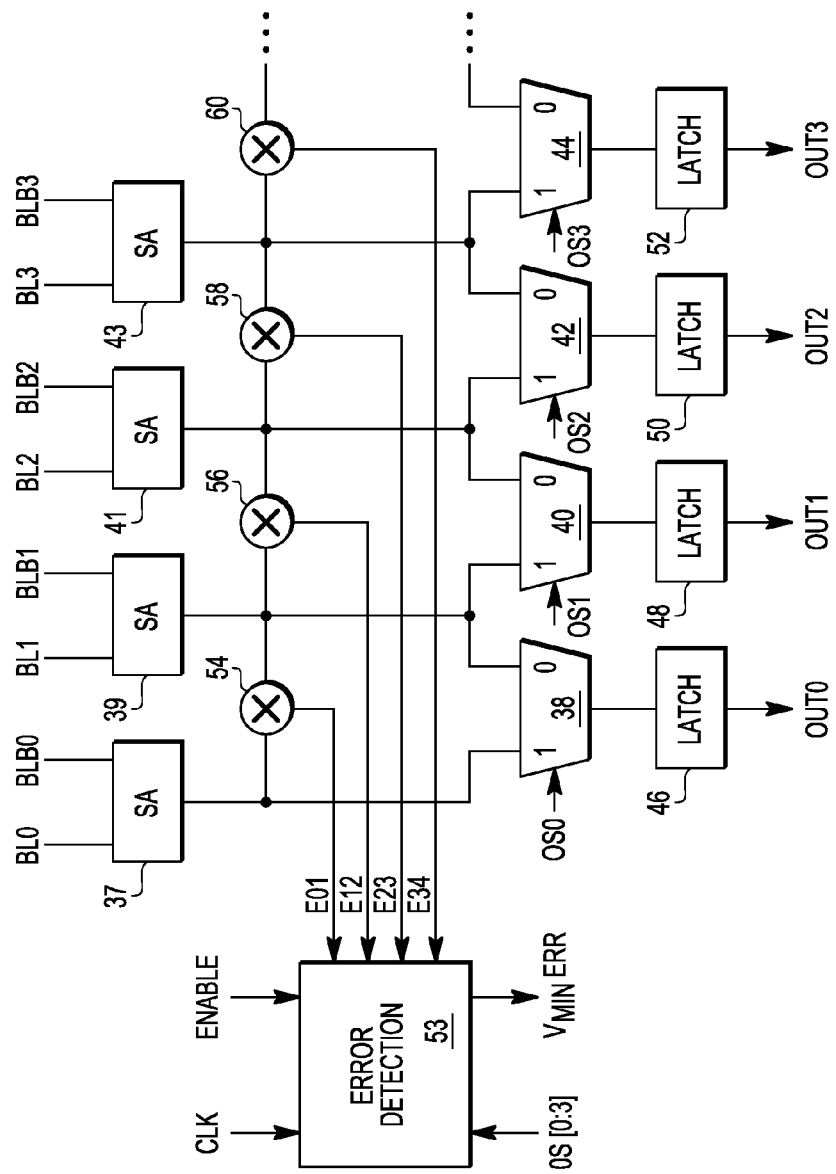
FIG. 3 illustrates, in partial block diagram form and partial logic diagram form, an output portion of the column logic and test circuits of the memory of FIG. 2.

FIG. 3 illustrates, in partial block diagram form and partial logic diagram form, an output portion of the column logic and test circuits 26 of FIG. 2 in accordance with an embodiment. The portion of column logic and test circuits 26 includes sense amplifiers 37, 39, 41, and 43, two-input multiplexers 38, 40, 42, and 44, latch circuits 46, 48, 50, and 52, comparators 54, 56, 58, and 60, and error detection circuit 53. Each of sense amplifiers 37, 39, 41, and 43 are coupled to a bit line pair, for example, sense amplifier 37 is coupled to bit line pair BL0/BLB0. In another embodiment, sense amplifiers 37, 39, 41, and 43 may be shared by more than one bit line pair using multiplexing circuits (not shown) and additional decoding. Outputs of sense amplifiers 37, 39, 41, and 43 are coupled to inputs of multiplexers 38, 40, 42, and 44 to allow a defective column to be repaired by shifting non-defective outputs to the left and adding the redundant column at the far right of the array. In another embodiment the replacement of defective memory cells may be accomplished differently. Depending on the embodiment, the sense amplifiers may provide a differential output or a single-ended output. Each of the multiplexers is controlled using a control signal provided by test circuits of column logic and test circuits 26. For example, multiplexer 38 receives output select control signal OS0, multiplexer 40 receives output select control signal OS1, multiplexer 42 receives output select control signal OS2, and multiplexer 44 receives output select control signal OS3. Output select control signals, including control signals OS0-OS3, are provided by memory controller and BIST 20 during a normal read operation or during a test operation to choose which bit line pair is to be coupled to which output latch. Outputs of multiplexers 38, 40, 42, and 44 are coupled to inputs of latches 46, 48, 50, and 52, respectively. Output signals OUT 0, OUT 1, OUT 2, and OUT 3, are provided by outputs of latches 46, 48, 50, and 52, respectively. Output signals OUT 0, OUT 1, OUT 2, and OUT 3 represent the output portion of bi-directional DATA signals illustrated in FIG. 2. A comparator is coupled between the outputs of adjacent sense amplifiers. For example, comparator 54 has an input coupled to the output of sense amplifier 37, and an input coupled to the output of sense amplifier 39, and an output for providing a comparison result labeled "E01". Comparator 56 has an input coupled to the output of sense amplifier 39, and an input coupled to the output of sense amplifier 41, and an output for providing a comparison result labeled "E12". Comparator 58 has an input coupled to the output of sense amplifier 41, and an input coupled to the output of sense amplifier 43, and an output for providing a comparison result labeled "E23". Comparator 60 has an input coupled to the output of sense amplifier 43, and an input coupled to the output of another sense amplifier adjacent to sense amplifier 43, and an output for providing a comparison result labeled "E34", where the other comparator is not shown. Note that three comparators are shown for illustration purposes; the number of comparators depends on the number of columns in the array. Each comparison result signal (E01, E12, E23, E34) is provided to an input of error detection circuit 53. In another embodiment, the placement and connection of comparators 54, 56, 58, and 60 with respect to sense amplifiers 37, 39, 41, and 43 may be different.

The circuitry of FIG. 3 allows array 28 to be tested for statistical VMIN weak bits, and depending on the operating mode, the VMIN weak bits can be repaired or used as test bits. During a test mode, a predetermined pattern of bits, such as for example, all ones, all zeros, a checkerboard pattern, or the like, are written to the memory array. Each memory cell is then read and the output bit is then compared to an adjacent bit. When a weak bit is located, the comparison result (E01 through E34 of FIG. 3) is output as well as the address of the weak bit to error detection circuit of memory controller and BIST 20. If either all ones or all zeros are written to the memory array 28, a logic "1" output from any of comparators 54, 56, 58, or 60 indicates a weak bit failure has been detected. If a checkerboard pattern is written to memory array 28, a logic "0" output from any of comparators 54, 56, 58, or 60 indicates a weak bit failure has been detected. The test can be done real-time during a functional operating mode or during a pre-scheduled time, such as for example, at power-on or power-on reset (POR).

During a read operation, a designated test bit, commonly characterized as being a "weak" bit, is compared to another bit of the array that is not a "weak" bit. The output of the comparison is used to determine if the memory cells of the array have an adequate operating margin when power supply voltage VDDM1 to the array is lowered for power conservation or increased for better performance. The read operation of the test bit can be accomplished at various times and during various operating modes. For example, in one embodiment, the statistical VMIN bits, that is, the bits that fail with the highest VMIN voltage, are repaired with redundant elements during a functional mode, and then tested during a test mode. In another embodiment, the test bits may be tested during predetermined time periods during a normal operating mode to provide a pre-warning of impending failure of the array bits that did not fail VMIN testing.

In another embodiment, the circuitry of FIG. 3 also allows array 28 to be tested for statistical VMAX weak bits, and depending on the operating mode, the VMAX weak bits can be repaired or used as test bits in a similar way as for VMIN weak bits described in FIG. 3 above. A VMAX weak bit is a bit that fails at a high power supply voltage but operates properly at a lower power supply voltage. In other embodiments, the placement and connection of two-input multiplexers 38, 40, 42, and 44 with respect to outputs of sense amplifiers 37, 39, 41, and 43 may be accomplished differently.

Figure 4:
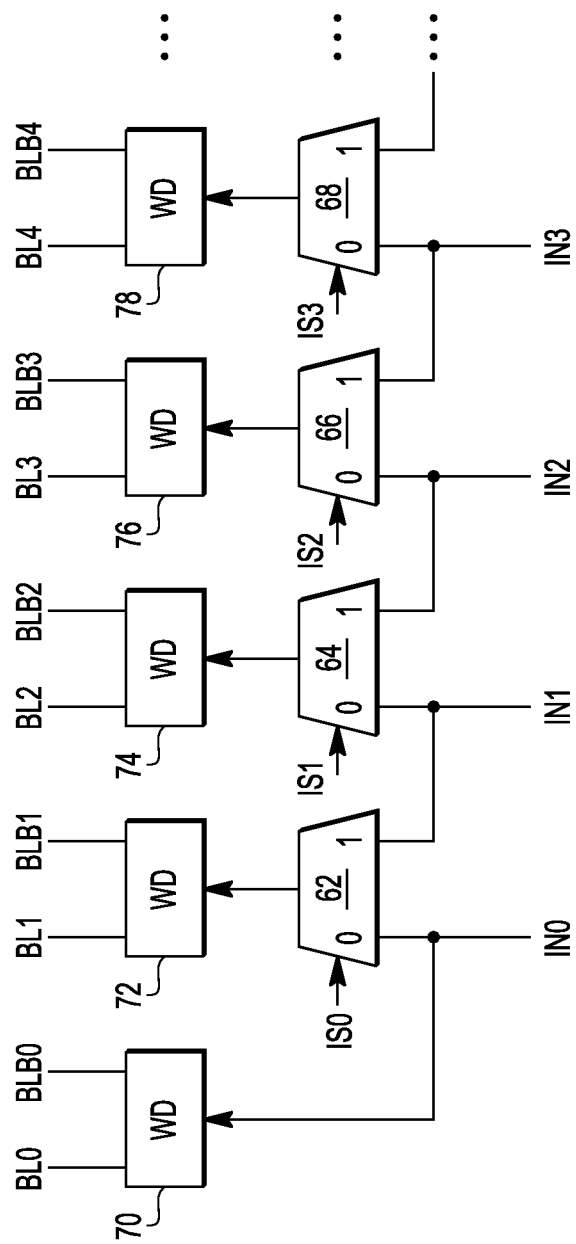
FIG. 4 illustrates, in partial block diagram form and partial logic diagram form, an input portion of the column logic and test circuits of the memory of FIG. 2.

FIG. 4 illustrates, in partial block diagram form and partial logic diagram form, an input portion of column logic and test circuits 26 of the memory of FIG. 2. The input portion includes two-input multiplexers 62, 64, 66, and 68, and write drivers 70, 72, 74, 76, and 78. Each multiplexer has an input coupled to receive an input data signal and another input coupled to receive another input data signal. For example, multiplexer 62 has a first input coupled to receive input data signal IN0, and a second input coupled to receive input data signal IN1. Multiplexers 64, 66, and 68 are coupled to receive input data signals, such as input data signals IN2 and IN3, similarly to multiplexer 62. Each multiplexer is controlled by an input select control signal provided by memory controller and BIST 20. Multiplexer 62 receives input select control signal IS0, multiplexer 64 receives signal IS1, multiplexer 66 receives signal IS2, and multiplexer 68 receives signal IS3. An output of each multiplexer is coupled to an input of a write driver. For example, an output of multiplexer 62 is coupled to an input of write driver 72. Note that input data signal IN0 is coupled directly to an input of write driver 70. The input select control signals IS0, IS1, IS2, and IS3 select which of two bit line pairs receive an input data signal based on VMIN testing. The worst VMIN bit is repaired and used as a VMIN test bit by shifting the other bits during a normal write operation.

The input portion of FIG. 4 is an inverse logic flow and signal mapping of the output portion of FIG. 3. By way of example, assume VMIN weak bits are detected in bit line pair BL1/BLB1. During a write operation to bit line pair BL1/BLB1, port 0 of multiplexer 62 will be selected by IS0 so that input data IN0 will be written to both the weak bits on BL1/BLB1 and to reliable bits on BL0/BLB0 that have the same row address. Registers in error detection circuit 53 will store the address of the weak bits, the selection of control signals IS0 and OS0, and comparison result E01. During a read operation, port 1 of multiplexer 38 and port 0 of multiplexer 40 will be selected to mask (repair) the output of sense amplifier 39 and comparison result E01 will be monitored for detected failures.

Figure 5:
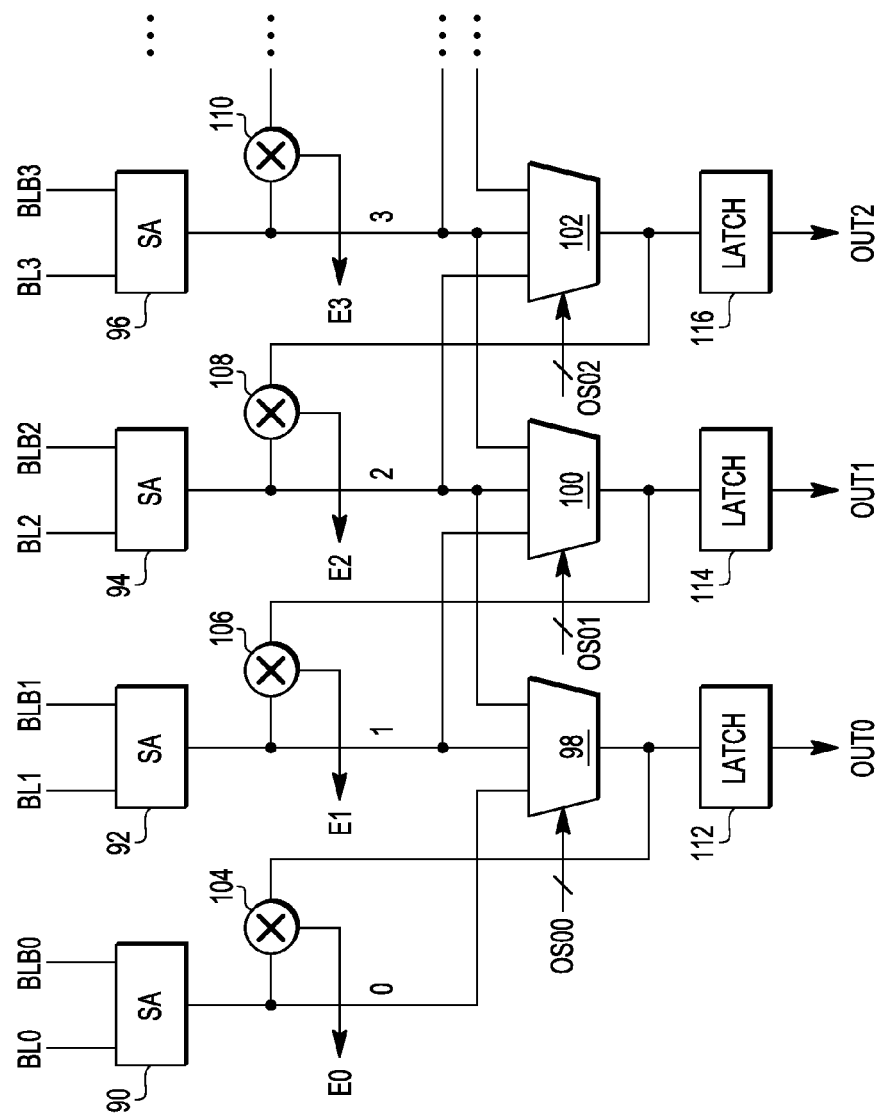
FIG. 5 illustrates, in partial block diagram form and partial logic diagram form, an output portion of the column logic and test circuits of the memory of FIG. 2.

FIG. 5 illustrates, in partial block diagram form and partial logic diagram form, an output portion of the column logic and test circuits 26 of the memory of FIG. 2 in accordance with another embodiment. The portion includes sense amplifiers 90, 92, 94, and 96, multiplexers 98, 100, and 102, comparators 104, 106, 108, and 110, and latches 112, 114, and 116. In the embodiment of FIG. 5, multiplexers 98, 100, and 102 are three-input multiplexers instead of the two-input multiplexers illustrated in FIG. 3. The three-input multiplexers allow the I/O (input/output) circuitry to perform shift-repairing of VMIN weak bits as well as repairing of "hard" defects. Each of sense amplifiers 90, 92, 94, and 96 has an input coupled to bit line pairs. In the embodiment illustrated in FIG. 5, only one bit line pair is coupled to each sense amplifier. In other embodiments, there may be more than one bit line pair coupled to a sense amplifier with corresponding additional decoding circuits. Each multiplexer has three inputs, where each input is coupled to an output of a sense amplifier. In one embodiment, the multiplexers are coupled to the sense amplifiers so that a VMIN weak cell can be shifted out and repaired. For example, multiplexer 98 has a first input coupled to the output of sense amplifier 90, a second input coupled to the output of sense amplifier 92, and a third input coupled to the output of sense amplifier 94. Multiplexer 100 has a first input coupled to the output of sense amplifier 92, a second input coupled to the output of sense amplifier 94, and a third input coupled to the output of sense amplifier 96. Multiplexer 102 has a first input coupled to the output of sense amplifier 94, a second input coupled to the output of sense amplifier 96, and a third input coupled to the output of another sense amplifier (not shown). The multiplexers 98, 100, and 102 are controlled by output select control signals OS00, OS01, and OS02, respectively. The output select control signals are provided by memory controller and BIST 20 of FIG. 2. The output of each of multiplexers 98, 100, and 102 is coupled to the input of a latch 112, 114, and 116, respectively. During a read operation, the output of latch 112 provides output data signal OUT0, the output of latch 114 provides output data signal OUT1, and the output of latch 116 provides output data signal OUT2.

Comparators 104, 106, 108, and 110 are used during BIST testing to locate VMIN weak bits. A known logic state is written to each memory cell of the array, for example, all ones, all zeros, or a checkerboard pattern. The memory cells are then tested by comparing the output of one sense amplifier with the output of another sense amplifier during a read operation of a selected cell. For example, to test a selected cell that is coupled to bit line pair BL0/BLB0 for a VMIN failure, for example cell 30 of FIG. 2, the logic state of the selected cell is read via sense amplifier 90. Output select OS00 selects another sense amplifier output to compare with the logic state of the selected cell under test, either sense amplifier 92 or sense amplifier 94 if sense amplifier 92 has been "repaired" because of "hard" defects. If a selected cell is functioning properly the output of comparator 104 will indicate that both of sense amplifiers 90 and 92 are the same by outputting error signal EU at a predetermined logic state, for example, a logic high. However, if one of the selected cell under test or the cell that is providing the other comparator input is different from the other, then one of the cells is malfunctioning as indicated by comparator 104 outputting a different predetermined logic state, for example, a logic low. To determine which cell is malfunctioning, output select signal OS00 of multiplexer 98 can be used to select the output of another sense amplifier, such as sense amplifier 94, to compare with the output of sense amplifier 90.

Using a three-input multiplexer allows hard defects as well as VMIN weak bits to be corrected with one more conventional redundant repair column I/O element than the column repair embodiment having a two-input multiplexer shifting scheme as described above and illustrated in FIG. 3. For example, if VMIN weak bits are detected on bit line pair BL0/BLB0 and if no "hard" defects are detected on bit line pair BL1/BLB1, then output select signal OS00 selects the output of sense amplifier 92 to compare with the output of sense amplifier 90 by a first selection of signal OS00. During a write operation, the VMIN weak bits of bit line pair BL0/BLB0 are written with the same data that is written into the proven reliable cells on BL1/BLB1 that are coupled to the same word line. If any "hard" defects were found on BL1/BLB1 that were repaired by masking out the output of sense amplifier 92 and shifting the output of sense amplifier 94 through multiplexer 98 into the input of latch 112, the output select signal OS00 will select the output of sense amplifier 94 to compare with the output of sense amplifier 90 by a second selection of signal OS00.

Still referring to FIG. 5, the addresses of VMIN weak bits and "hard" defect bits, the selection of control signal OS00, and comparison result EU are recorded in registers of error detection circuit 53. Then, if column BL0/BLB0 includes VMIN weak bits and column BL1/BLB1 includes hard defects, the use of three-input multiplexers as illustrated in FIG. 5 allow data to be provided to column BL2/BLB2 via sense amplifier 96 and multiplexer 98 in response to output select signal OS00. Note that in other embodiments, the placement and connection of the three-input multiplexers with respect to the outputs of the sense amplifiers and/or comparators may be accomplished differently.

Figure 6:
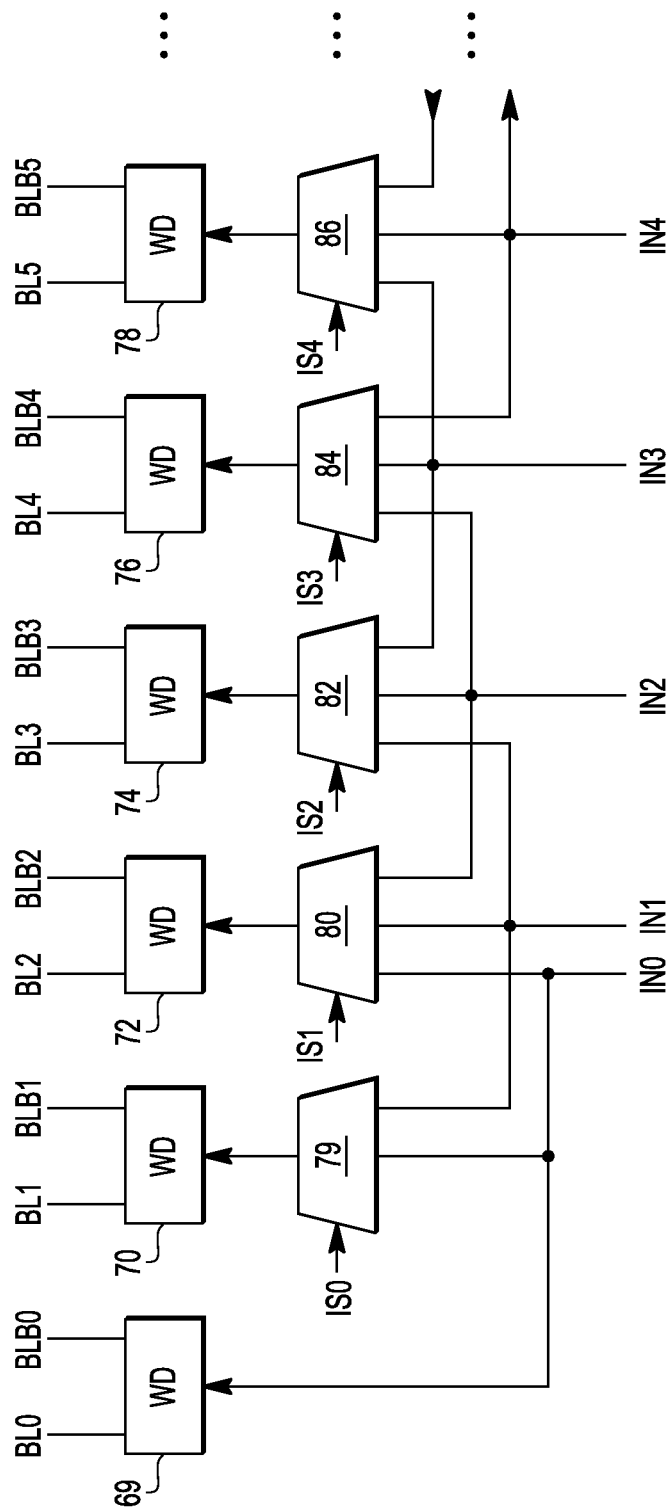
FIG. 6 illustrates, in partial block diagram form and partial logic diagram form, an input portion of the column logic and test circuits of the memory of FIG. 2.

FIG. 6 illustrates, in partial block diagram form and partial logic diagram form, an input portion of the column logic and test circuits of the memory of FIG. 2 in accordance with another embodiment. The input portion of FIG. 6 includes three-input multiplexers to allow the hard defects and VMIN weak defects to be repaired. In one embodiment, the input portion of FIG. 6 may be used in conjunction with the output portion of FIG. 5 in column logic and test circuits 26 (FIG. 2). The input portion includes two-input multiplexer 79, three-input multiplexers 80, 82, 84, and 86, and write drivers 69, 70, 72, 74, 76, and 78.

Write driver 69 has an input coupled to receive input data signal IN0, and an output coupled to bit line pair BL0/BLB0. Multiplexers 79, 80, 82, 84, and 86 each have an output coupled to the input of a respective one of write drivers 70, 72, 74, 76, and 78. Also, each of write drivers 70, 72, 74, 76, and 78 have an output coupled to a bit line pair. Multiplexer 79 has a first input for receiving input data signal IN0, a second input for receiving input data signal IN1, a control input for receiving input select signal IS0, and an output coupled to the input of write driver 70. As illustrated in FIG. 6 each of multiplexers 80, 82, 84, and 86 can receive and output one of three input data signals in response to an input select signal (IS1-IS4).

The input portion of FIG. 6 is structured as an inverse logic flow and signal mapping of the output portion of FIG. 5. During a write operation to memory array 28, an input data signal, such as one of input data signals IN0-IN4 can be steered to one of three different bit line pairs using multiplexers 79, 80, 82, 84, and 86. As described above in the description of FIG. 5, this allows hard defects as well as VMIN weak bits to be repaired for the same memory array by providing the ability to shift input data signals away from columns having defective memory cells during write operations.

Figure 7:
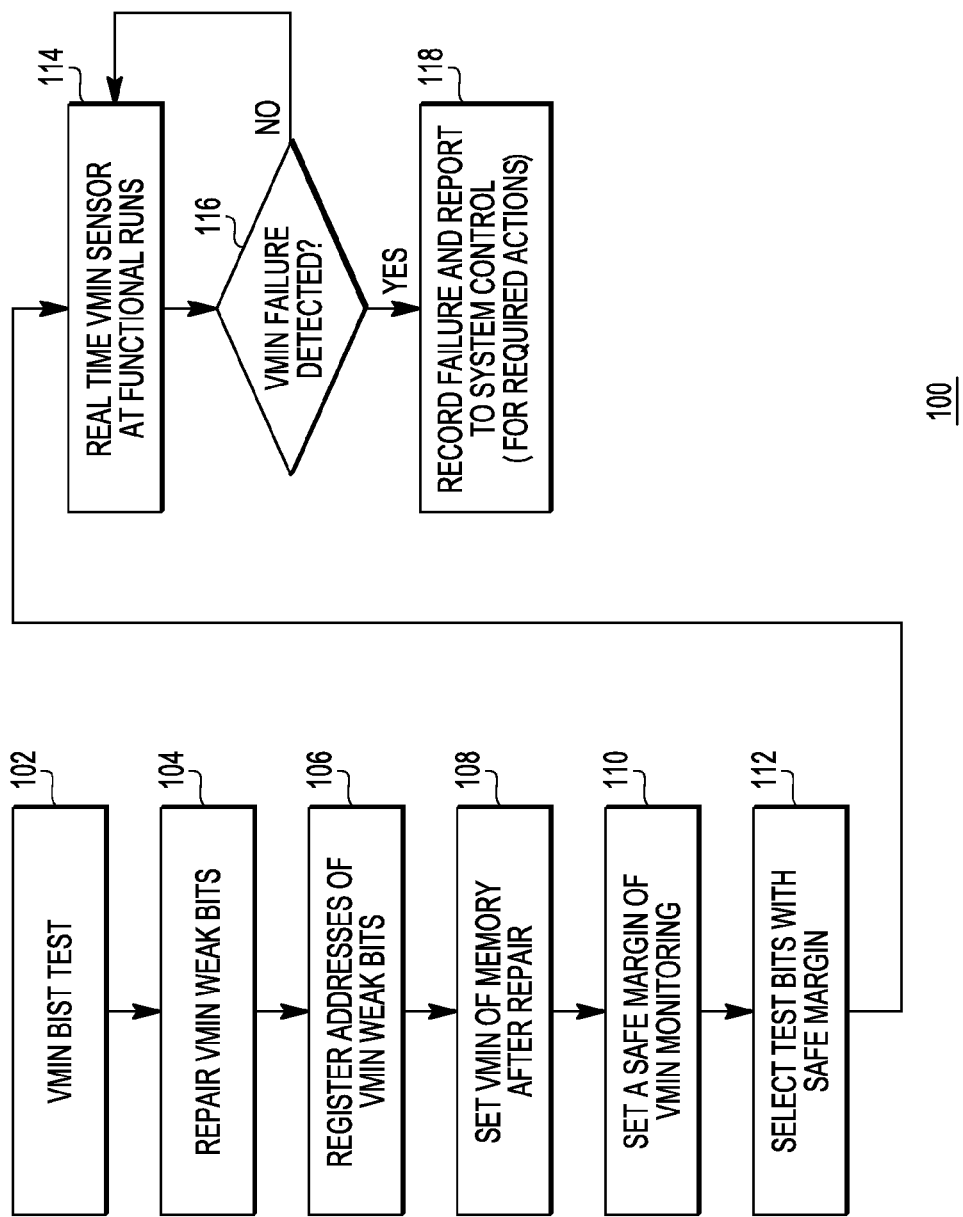
FIG. 7 illustrates a flow chart of a method for testing a memory in accordance with an embodiment.

FIG. 7 illustrates a flow chart of a method 100 for testing memory array 28 in accordance with an embodiment. Some memory cells of an array can operate at a lower power supply voltage than others. To conserve power and extend battery life in battery powered applications, it is desirable to operate an integrated circuit at the lowest power supply voltage practical. To determine if the memory will operate at a specified lower power supply voltage, and to determine which cells fail first as the power supply voltage is lowered to the specified value, a VMIN BIST test mode is entered as indicated at step 102. The VMIN BIST test mode tests each memory cell of the array at different power supply voltages under specified conditions. The tests are used to determine, for example, the minimum power supply voltage (VMIN) for the specified conditions that the memory cells will function reliably. There are several ways to determine the VMIN weak bits of memory array 28. For example, in one embodiment, the VMIN weak bits are determined as described above in the discussion of FIGS. 3-6. In another embodiment, the weak VMIN bits may be determined in a different way. At step 104, the VMIN weak bit or bits are identified and repaired. In one embodiment, the weak VMIN bits may be repaired by shifting one or more I/Os using the two-input multiplexers of FIGS. 3 and 4 or the three-input multiplexers of FIGS. 5 and 6 as described above. At step 106 the addresses of the VMIN weak bits are stored in registers 22 of FIG. 1. At step 108, the minimum power supply voltage at which the memory array will operate reliably, excluding the VMIN weak bits, is set in registers 22. The power supply voltage to the memory will not be allowed to be lowered below VMIN. At step 110, a safe voltage margin is set and stored in registers 22 for monitoring memory operation at a lowered power supply voltage. At step 112, the VMIN weak bits are established as test bits for the memory array. At step 114, real-time VMIN testing occurs during read and/or write operations to memory array 28. At decision step 116, real-time testing for VMIN weak bits occurs until a failure is detected in the test cells for a predetermined power supply voltage. The failure VMIN in the test cells is used as a failure predictor for the other cells of the array. When a test failure is detected (predicted), the YES path is taken from step 116 to step 118. At step 118, the failure is reported to memory controller and BIST 20 and appropriate actions are taken.

Figure 8:
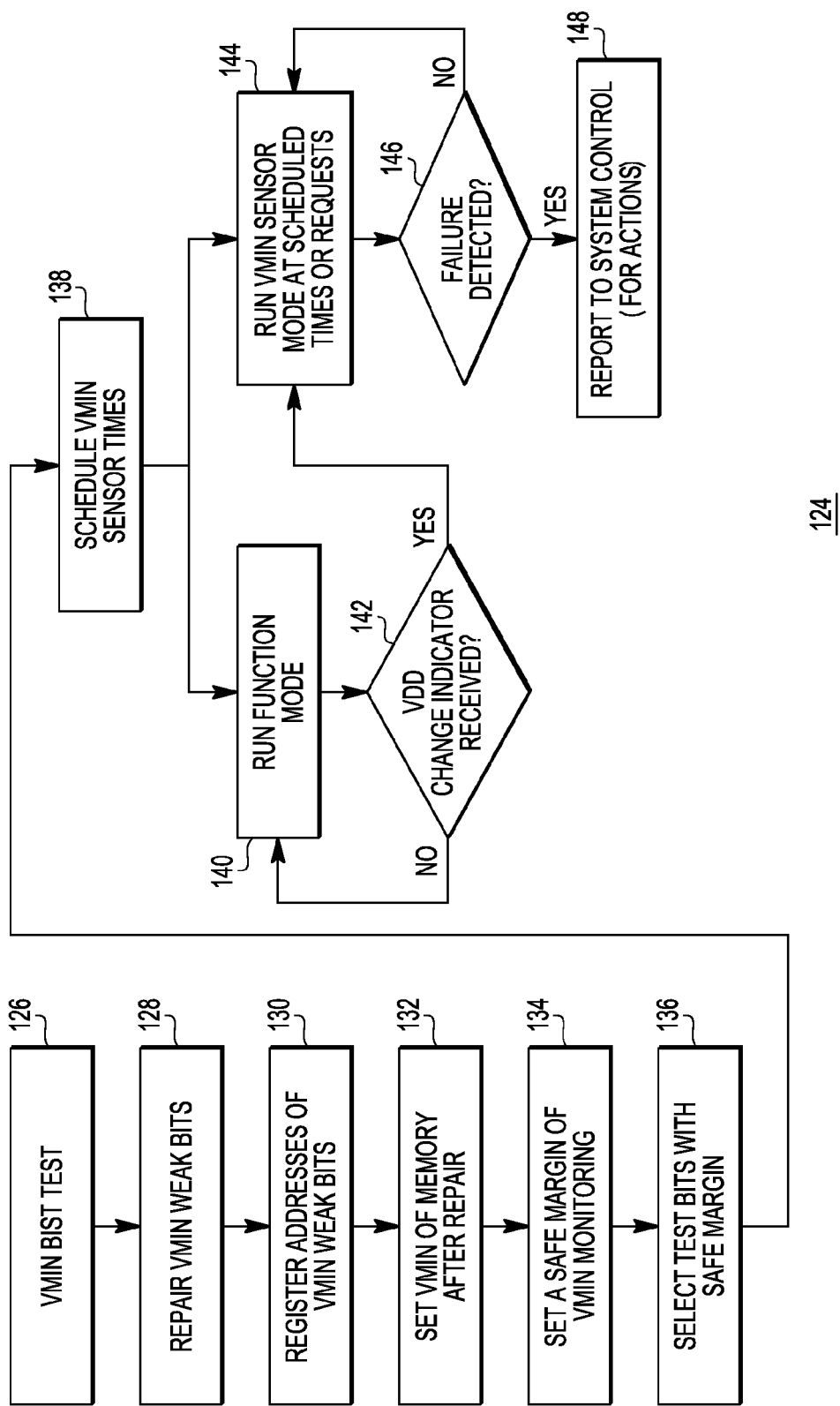
FIG. 8 illustrates a flow chart of a method for testing a memory in accordance with another embodiment.

FIG. 8 illustrates a flow chart of a method 124 for testing memory array 28 in accordance with another embodiment. At step 126, a VMIN BIST test mode is entered as described above regarding method 100 of FIG. 7. At step 128, the VMIN weak bit or bits are identified and repaired. In one embodiment, the weak VMIN bits may be repaired by shifting one or more I/Os using the two-input multiplexers of FIGS. 3 and 4 or the three-input multiplexers of FIGS. 5 and 6 as described above. At step 130 the addresses of the VMIN weak bits are stored in registers 22 of FIG. 1. At step 132, the minimum power supply voltage at which the memory array will operate reliably excluding the VMIN weak bits is set in registers 22. The minimum power supply voltage may be different than the voltage at which the VMIN weak bits failed. The power supply voltage to the memory will not be allowed to be lowered below VMIN. At step 134, a safe voltage margin is set and stored in registers 22 for monitoring memory operation at a lowered power supply voltage. At step 136, the VMIN weak bits are established as test bits for the memory array. At step 138, determine schedule of VMIN sensor times. For example, the VMIN sensor times may be times when memory array 28 is not expected to be accessed. After step 138, one of two types of testing can be selected at step 140 or step 144. At step 140, a functional mode allows real-time monitoring of bits of the array during normal read and write operations using the output and input portions of column logic 26 described in FIGS. 3-6. At step 144, a VMIN sensor mode is run at the times scheduled at step 138. Assuming the functional mode of step 140 is running, at decision step 142, the YES path to step 144 is taken if a power supply voltage change indicator is received to indicate that the power supply voltage is being changed by processor 12. The power supply voltage change indicator may be a VID that is different than the current VID and may identify a lower power supply voltage than the current power supply voltage. At step 144, the VMIN sensor mode is run based on a request because of the power supply voltage change. At decision step 146, if a failure is detected as a result of the VMIN sensor mode tests, then the YES path is taken to step 148 and the failure is reported so that appropriate action may be taken. In this case, a schedule of VMIN sensor tests is activated by a system level power supply voltage change indicator (request). In another embodiment, setting a schedule of VMIN sensor tests in step 138 may be via the integrated circuit power on reset (POR) or power up blocks.

In another embodiment, the flow charts of method 100 and method 124, described above, may be used for testing memory array 28 for statistical VMAX weak bits or VMIN and VMAX weak bits.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of system 10 are circuitry located on a single integrated circuit or within a same device. Alternatively, system 10 may include any number of separate integrated circuits or separate devices interconnected with each other. For example, memories 14 and/or 16 may be located on a same integrated circuit as processor 12 or on a separate integrated circuit or located within another peripheral or slave discretely separate from other elements of system 10.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A method of operating a memory system having a memory controller and a first memory with an array of memory cells that receives a power supply voltage, wherein the power supply voltage has a first value during a low power operating mode and the power supply voltage has a second value during a normal operating mode, the second value being higher than the first value, the method comprising:
   identifying a test memory cell from a redundant column in the array that substitutes for a first column in the array, wherein the test memory cell becomes non-functional at a higher power supply voltage than the memory cells of the array; and
   determining, by the memory controller, if the test memory cell is functional at the first value for the power supply voltage during a read operation of the first memory to determine if the array of memory cells of the first memory have an adequate operating margin when the power supply voltage is lowered to the first value.

2. The method of claim 1, wherein the memory system further includes a voltage regulation circuit, and the method further comprises:
   supplying the power supply voltage by the voltage regulation circuit.

3. The method of claim 2, wherein the memory system further includes a processor, and the method further comprises:

selecting values of the power supply voltage, by the processor, for the voltage regulation circuit to provide to the array.

4. The method of claim 3, wherein the processor selects the second value of the power supply voltage for the voltage regulation circuit when the memory controller determines that the test memory cell is not functional with the power supply voltage at the first value.

5. The method of claim 4, wherein the processor selects a third value, which is less than the first value, of the power supply voltage for the voltage regulation circuit to supply to the array when the memory controller determines that the test memory cell is functional with the power supply voltage at the first value.

6. The method of claim 5, wherein, when the processor selects the third value, the memory controller determines if the test memory cell is functional at the third value for the power supply voltage.

7. The method of claim 6, wherein the processor selects a fourth value, which is less than the third value, of the power supply voltage for the voltage regulation circuit to supply to the array when the memory controller determines that the test memory cell is functional with the power supply voltage at the third value.

8. The method of claim 1, wherein:
the test memory cell is more stable in a first logic state than a second logic state; and
the memory controller determines if the test memory cell is functional when the test memory cell is in the second logic state.

9. The method of claim 8, further comprising:
determining, by the memory controller, if the test memory cell is functional when the test memory cell is in the first logic state.

10. The method of claim 1, wherein:
the test memory cell is coupled to a word line;
a functional column is adjacent to the first column;
a functional memory cell in the functional column is coupled to the word line;
the memory controller writes data that is the same to the first column and the functional column; and
the memory controller determines if the test memory cell is functional by comparing a logic state of the functional memory cell to a logic state of the test memory cell.

11. The method of claim 1, wherein:
the first memory comprises a plurality of sense amplifiers, wherein the first column is coupled to first sense amplifier of the plurality of sense amplifiers; and
wherein the system further includes a plurality of multiplexers, wherein each multiplexer is coupled to adjacent pairs of sense amplifiers of the plurality of sense amplifiers wherein each sense amplifier is coupled to two multiplexers of the plurality of multiplexers.

* * * * *